United States Patent [19]
Champlin

[11] Patent Number: 5,809,036
[45] Date of Patent: Sep. 15, 1998

[54] BOUNDARY-SCAN TESTABLE SYSTEM AND METHOD

[75] Inventor: Cary Richard Champlin, Chandler, Ariz.

[73] Assignee: Motorola, Inc., Schaumburg, Ill.

[21] Appl. No.: 158,345

[22] Filed: Nov. 29, 1993

[51] Int. Cl.⁶ ..................................................... G06F 11/22
[52] U.S. Cl. .............................. 371/22.31; 371/22.324; 324/73.1
[58] Field of Search .................. 371/22.3, 15.1, 371/22.31, 22.32; 324/73.1–158 R

[56] References Cited

U.S. PATENT DOCUMENTS

| | | | |
|---|---|---|---|
| 4,701,921 | 10/1987 | Powell et al. .............................. | 371/25 |
| 4,860,290 | 8/1989 | Daniels et al. ............................. | 371/25 |
| 4,875,003 | 10/1989 | Burke ........................................ | 342/73 |
| 4,967,142 | 10/1990 | Sauerwald et al. ....................... | 32/73.1 |
| 5,032,783 | 7/1991 | Hwang et al. ........................... | 324/73.1 |
| 5,103,450 | 4/1992 | Whetsel .................................... | 371/22.1 |
| 5,109,190 | 4/1992 | Sakashita et al. ........................ | 371/15.1 |
| 5,115,191 | 5/1992 | Yoshimori ................................. | 324/158 |
| 5,115,435 | 5/1992 | Langford et al. ........................ | 371/22.3 |
| 5,130,988 | 7/1992 | Wilcox et al. ........................... | 371/22.3 |
| 5,150,044 | 9/1992 | Hashizume et al. .................. | 324/158 R |
| 5,198,759 | 3/1993 | Ohnesorge ............................ | 324/158 R |
| 5,202,991 | 4/1993 | Gamache et al. ..................... | 364/281.3 |
| 5,222,068 | 6/1993 | Burchard .................................. | 371/22.3 |
| 5,325,368 | 6/1994 | James et al. ............................. | 371/22.3 |
| 5,343,478 | 8/1994 | James et al. ............................. | 371/22.3 |
| 5,377,198 | 12/1994 | Simpson et al. ........................ | 371/22.3 |

OTHER PUBLICATIONS

"Boundary–Scan Test A Practical Approach" by Harry Bleeker and Peter van den Eijnden, from Phillips Research Laboratories, Eindhoven, The Netherlands, 1993.

*Primary Examiner*—John E. Barlow, Jr.
*Assistant Examiner*—Craig Steven Miller
*Attorney, Agent, or Firm*—Bradley J. Botsch, Sr.

[57] ABSTRACT

A system (10) includes any number of Boundary-Scan integrated circuits (28), a common bus (14), and a Boundary-Scan master (22). The integrated circuits (28) include mode selection logic (58) that isolates pins (30, 32) from core logic (34) during Capture-DR, Update-DR, Run-Test/Idle, and Select-DR-Scan states (66, 88, 62, 64) when a system action instruction is active so that a system action may be asserted. During all other states, including a Shift-DR state (82), the pins (30, 32) remain coupled to the core logic (34). The Boundary-Scan master (22) includes an arbitration interface (112). The arbitration interface (112) requests control of the common bus (14) prior to the time when the integrated circuits (28) assert a system action. The Boundary-Scan master arbitration interface (112) then releases control of the common bus after system action by the integrated circuits (28) is completed.

12 Claims, 5 Drawing Sheets

BOUNDARY-SCAN TESTABLE SYSTEM AND METHOD

TECHNICAL FIELD OF THE INVENTION

The present invention relates to Boundary-Scan testing of electrical circuits in accordance with *IEEE* 1149.1-1990: *IEEE Standard Test Access Port and Boundary-Scan Architecture*, and to similar testing architectures and techniques.

BACKGROUND OF THE INVENTION

As electrical circuits and systems become more complicated, sophisticated and miniaturized, techniques for viable automated testing of the circuits and systems become more important. Boundary-Scan represents an approach to testing that appears to be compatible with increasingly complicated, sophisticated and miniaturized circuits and systems. Currently, numerous integrated circuits, particularly complicated devices and application specific integrated circuits (ASICs), include Boundary-Scan features, and various Boundary-Scan support devices (e.g., Boundary-Scan masters) are commercially available.

An outline for Boundary-Scan architectures and methodologies is set forth in the IEEE 1149.1-1990standard. This standard is concerned with high-level testing approaches, and applies to all circuits and systems, regardless of their specific function. The standard discusses various public and private features, along with various mandatory and optional features. The standard permits a great deal of implementation flexibility within its framework.

The main focus of Boundary-Scan testing appears to be aimed at manufacturing environments. A system includes components or boards, hereinafter referred to as a unit or units under test (UUT). The system may benefit from testing the UUT to verify proper operation. Typically, the system need not perform the functions for which it has been designed during manufacturing testing. Consequently, the length of time required to perform any one test is of minor importance compared to performing a valid test.

A system need not test itself during manufacturing testing. The manufacturing tests may rely on an external test controller (e.g., a personal computer) running a program specifically configured to test the UUT. Boundary-Scan testing may disable system controller components (e.g., microprocessors etc.) without affecting testing viability. In a manufacturing environment, power to the UUT may be recycled or a reset signal asserted to restart a controller device after testing completion.

On-line testing imposes more severe constraints than manufacturing testing. Unfortunately, conventional Boundary-Scan techniques fail to adequately meet these constraints. On-line testing typically occurs "in the field" while a system continues to perform the functions for which it has been designed. Typically, on-line testing takes place in a background mode of operation, where system functions take place in a foreground mode of operation and the foreground and background modes are interleaved in time. Any one test should not consume an excessive amount of time because an adverse impact on system functions may result. Typically, no external controller is available for controlling the tests. System controllers, which themselves may be subjected to testing, may be given the job of controlling the tests. Consequently, testing should permit microprocessors to continue with their normal sequencing, with a minimum of resetting and power recycling.

SUMMARY OF THE INVENTION

Accordingly, it is an advantage of the present invention that an improved Boundary-Scan testable system and method is provided.

Another advantage of the present invention is that Boundary-Scan testing is extended to serve many on-line testing applications.

Another advantage is that the present invention adapts Boundary-Scan principles so that the influence of testing on system activities consumes less time.

Another advantage is that the present invention adapts Boundary-Scan principles so that embedded system controllers may control system testing without relying upon external testers.

The present invention advantageously adapts Boundary-Scan principles, allowing testing of systems including shared system resources (e.g., common busses).

The above and other advantages of the present invention are carried out in one form by a method and system for testing an integrated circuit including at least one output pin, core logic, an instruction register, a test access port (TAP) controller operable in a plurality of states, including an Update-DR state and a Shift-DR state, and a Boundary-Scan cell coupled between the core logic and the output pin. The method and system call for isolating the output pin from the core logic during the Update-DR state when the instruction register contains an external test (EXTEST) instruction. The output pin is coupled to the core logic during the Shift-DR state when the instruction register contains the EXTEST instruction.

These and other advantages of the present invention are carried out in another form by a method and system for operating a Boundary-Scan master coupled to a data/control bus. The method and system call for determining when an external test (EXTEST) instruction will assert a system action. Data/control bus control is requested prior to assertion of system actions.

BRIEF DESCRIPTION OF THE DRAWINGS

A more complete understanding of the present invention may be derived by referring to the detailed description and claims when considered in connection with the Figures, wherein like reference characters refer to similar items throughout the Figures, and:

DETAILED DESCRIPTION OF THE PREFERRED EMBODIMENTS

Figure 1:
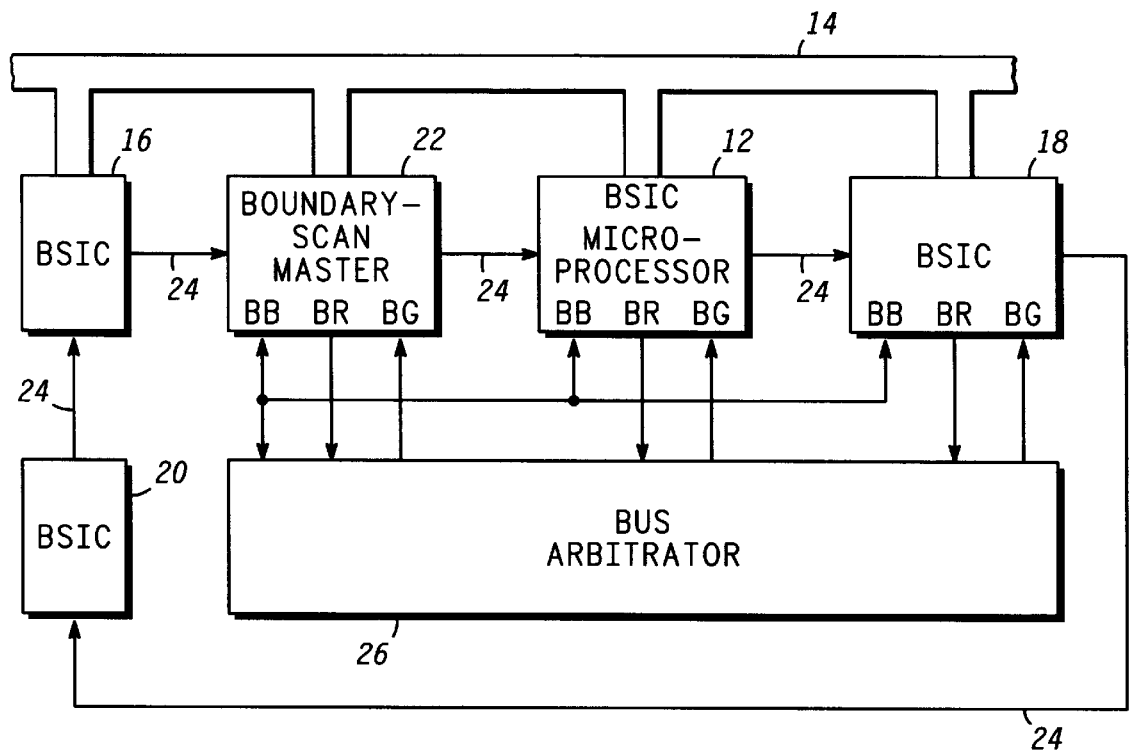
FIG. 1 is a block diagram of an exemplary system configured in accordance with the teaching of the present invention.

FIG. 1 is a block diagram of exemplary system 10, comprising a generic computer or microprocessor architecture. However, the precise configuration of system 10 is unimportant to the present invention, and system 10 may represent other types of electronic circuits coupled together into a system.

Microprocessor or other controller 12 couples to an address, data, and control bus 14 (hereinafter D/C bus 14).

In preferred embodiments of the present invention, microprocessor 12 represents a Boundary-Scan integrated circuit (BSIC), a component including elements to support Boundary-Scan testing. Other components likewise couple to D/C bus 14, i.e., BSICs 16, 18. BSICs 16, 18 represent any of numerous integrated circuits known to those skilled in the art as being usable in microprocessor designs. Such integrated circuits may include buffers, interface devices, memory devices, peripherals, direct memory access (DMA) controllers, other microprocessors etc. System 10 may also include other BSICs, e.g., BSIC 20, not coupled to D/C bus 14.

System 10 further includes Boundary-Scan master 22 coupled to D/C bus 14. Through D/C bus 14, Boundary-Scan master 22 receives programming data from microprocessor 12. These programming data define how to configure Boundary-Scan tests for system 10, including microprocessor 12.

Boundary-Scan master 22 supports one or more Boundary-Scan chains 24 (FIG. 1 depicts only one chain 24 for clarity). Chain 24 incorporates various ones of the BSICs included in system 10, and these BSICs are serially coupled together (i.e., daisy chained). Generally speaking, in response to programming data received at Boundary-Scan master 22, test vector data originate at Boundary-Scan master 22 and are serially routed through the BSICs in chain 24 to load various registers in the BSICs. Likewise, test signature data originated at the BSICs are serially routed through chain 24 back to Boundary-Scan master 22.

As is typical for microprocessor architectures and other designs, any number of BSICs and other devices may couple to a common shared resource, such as D/C bus 14. More than one of these devices may control D/C bus 14 from time to time. In other words, more than one of these devices may output data via D/C bus 14. These data may request other devices to respond therethrough.

In order to prevent interference among users of D/C bus 14, system 10 includes bus arbitrator 26. In the embodiment illustrated in FIG. 1, each device which may granted control of D/C bus 14 couples to bus arbitrator 26. Such devices include at least microprocessor 12 and Boundary-Scan master 22. Each of these devices includes pins to support a bus request (BR) output signal, a bus granted (BG) input signal, and a bus busy (BB) input/output (I/O) signal, each routed to bus arbitrator 26, and the bus busy pins from all such bus-grabbing devices couple together. Bus arbitrator 26 prioritizes the requests it receives for control of D/C bus 14 and grants control of D/C bus 14 in accordance with its prioritization scheme and its currently received requests. Devices which may control D/C bus 14 refrain from controlling D/C bus 14 unless they have first requested and been granted bus control and other users have released the bus busy signal.

Not all devices included in system 10 need to be BSICs, e.g., Boundary-Scan master 22 and bus arbitrator 26. On the other hand, nothing prevents Boundary-Scan master 22 and bus arbitrator 26 from being BSICs in various applications. Moreover, in other applications, bus arbitrator 26 may itself couple to D/C bus 14 to receive programming data from microprocessor 12.

Figure 2:
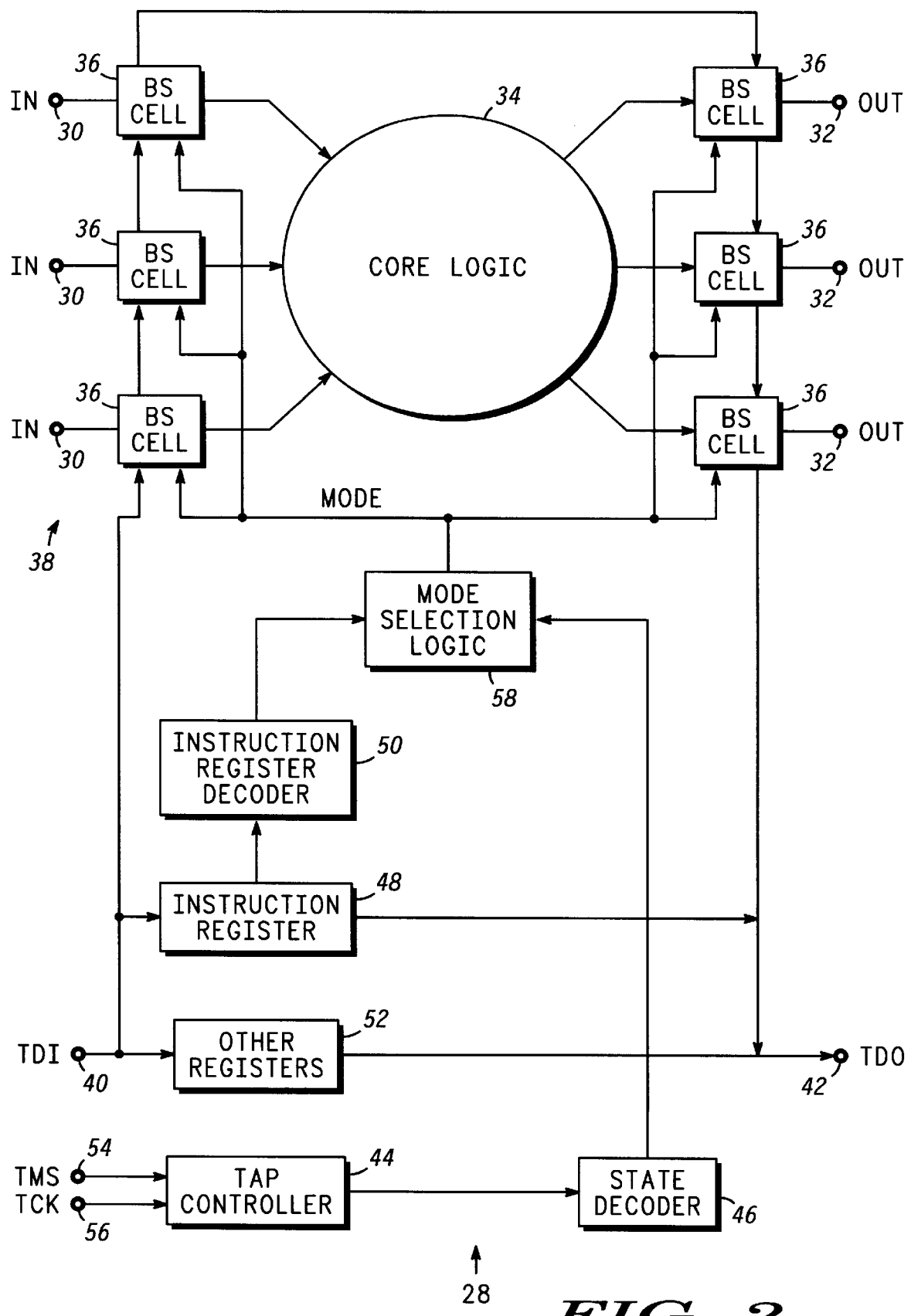
FIG. 2 is a block diagram of an exemplary Boundary-Scan integrated circuit (BSIC)

FIG. 2 is a block diagram of exemplary BSIC 28, representing any one of BSICs 12, 16, 18, 20 (FIG. 1). BSIC 28 includes plurality of input pins 30, plurality of output pins 32, and core logic section 34. I/O pins may be substituted for any of pins 30, 32 and three-state pins may be substituted for output pins 32, but these are omitted in FIG. 2 for clarity. Any number of input and/or output pins 30 and/or 32 may be included in BSIC 28.

For the purposes of Boundary-Scan testing, system elements are deemed to reside within core logic section 34, external to pins 30, 32. Core logic section 34 performs the system-related functions performed by BSIC 28 in system 10 (FIG. 1). In other words, it is core logic sections 34 in the various BSICs included in system 10, along with other non-BSIC devices, that permit system 10 to accomplish its tasks. The precise configuration or nature of core logic 34 varies from BSIC 28 to BSIC 28.

Boundary-Scan (BS) cells 36 selectively couple and isolate core logic section 34 from input pins 30 and output pins 32. Each BS cell 36 that is used with an input pin 30 couples between an input pin 30 and core logic 34. Each BS cell 36 that is used with an output pin 32 couples between core logic 34 and an output pin 32. Not all of the pins of BSIC 28 need be associated with BS cell 36. For example, power pins and pins providing bus request signals may omit an association with BS cell 36.

Each of BS cells 36 receives a common MODE input signal. In addition, each of BS cells 36 couples to other BS cells 36 in a serial fashion so that BS cells 36 collectively form Boundary-Scan register 38. A test data input (TDI) input pin 40 drives the input of Boundary-Scan register 38. The last BS cell 36 in Boundary-Scan register 38 couples to test data output (TDO) output pin 42. Chain 24 (FIG. 1) is formed from series connections between all Boundary-Scan registers 38 of the BSICs included in the chain.

As described so far, BS cells 36 and core logic 34 represent conventional BS cells and core logic sections. Furthermore, BSIC 28 includes test access port (TAP) controller 44, state decoder 46, instruction register 48, and instruction register decoder 50 similar or identical to those known in the art. BSIC 28 may also include other registers 52, such as an ID register, data register, bypass register etc., which are well known.

Instruction register 48 and other registers 52 couple in parallel across the input and output of Boundary-Scan register 38. Registers 48 and 52 represent shift registers receiving input data from TDI pin 40 and supplying output data through TDO pin 42. Parallel outputs from instruction register 48 couple to inputs of instruction register decoder 50. Thus, instruction register decoder 50 determines which instruction may be currently active for BSIC 28.

Test mode select (TMS) and test clock signals are applied at TMS and TCK pins 54, 56, respectively. Pins 54, 56 couple to TAP controller 44 and couple in parallel among the various BSICs 28 included in system 10 (FIG. 1). TMS and TCK signals are generated by Boundary-Scan master 22 (FIG. 1). TAP controller 44 represents a state machine sequencing between various states in response to the TMS signal logic level when clocked by the TCK signal. An output of TAP controller 44 couples to an input of state decoder 46. State decoder 46 determines when various states are executed by TAP controller 44.

Figure 3:
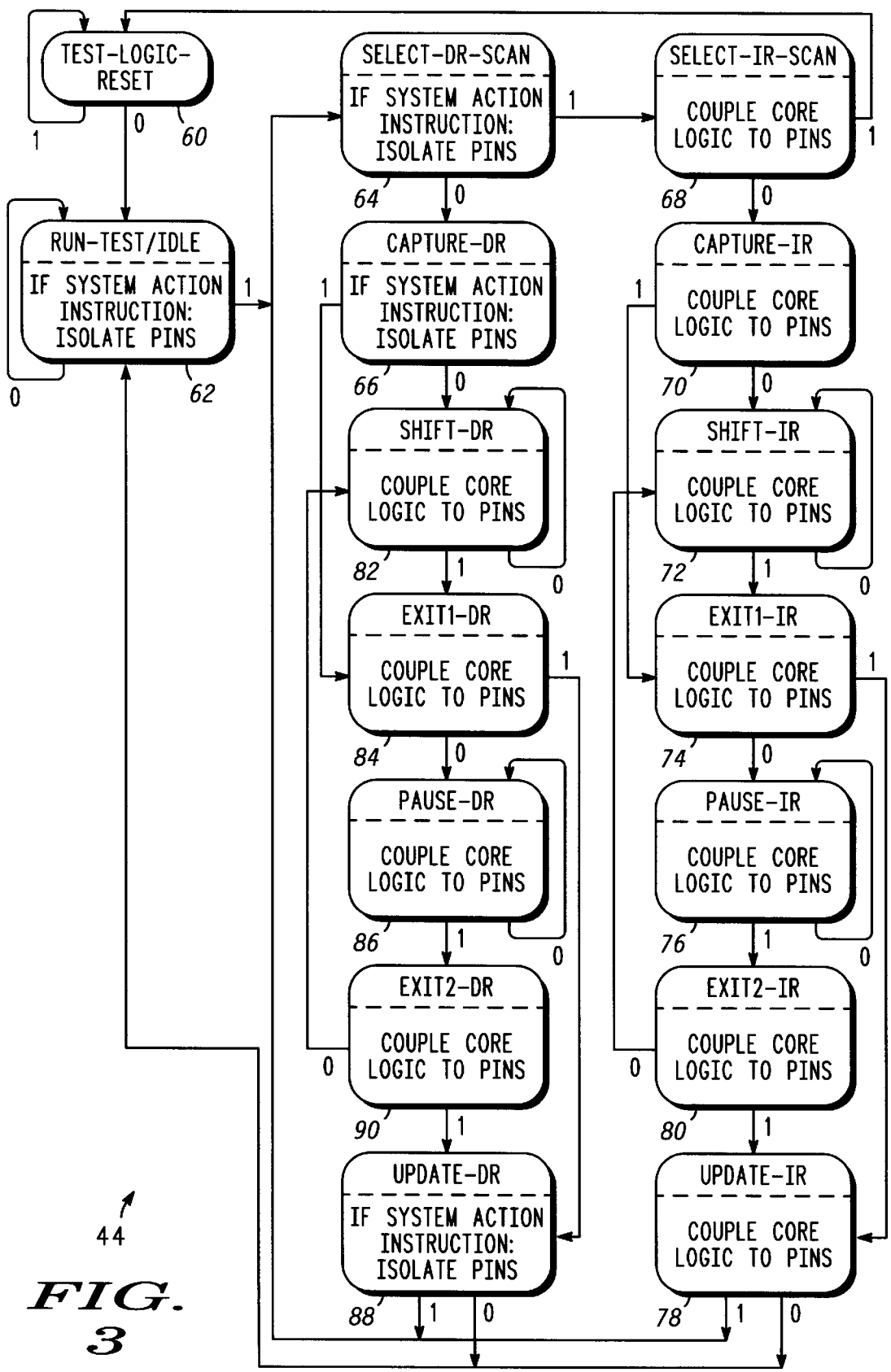
FIG. 3 is a state diagram for a BSIC test access port (TAP) controller.

FIG. 3 is a state diagram depicting various states in which TAP controller 44 operates. These states, well known in the art, are briefly discussed below. Activities occurring during these states (FIG. 2) as a result of mode selection logic 58 permit BSIC 28 to operate in accordance with the teaching of the present invention. Mode selection logic 58 receives inputs from instruction register decoder 50 and state decoder 46 and responds by generating the above-discussed MODE signal, which controls coupling of core logic 34 to, and isolation of core logic 34 from, pins 30, 32 through BS cells 36.

The state of the TMS signal present at pin 54 when clocked by the TCK signal controls the sequencing of TAP controller 44 through its various states, summarized below. When TAP controller 44 is in Test-Logic-Reset state 60 (FIG. 3), it remains in state 60 when the TMS signal is high ("1") but moves to Run-Test/Idle state 62 when the TMS signal is low ("0"). When TAP controller 44 is in Run-Test/Idle state 62, it remains in state 62 when the TMS signal is low but moves to Select-DR-Scan state 64 when the TMS signal is high.

When TAP controller 44 is in state 64, program control moves to Capture-DR state 66 when the TMS signal is low but moves to Select-IR-Scan state 68 when the TMS signal is high. When TAP controller 44 is in state 68, program control moves to Capture-IR state 70 when the TMS signal is low but moves back to Test-Logic-Reset state 60 when the TMS signal is high. When TAP controller 44 is in state 70, program control moves to Shift-IR state 72 when the TMS signal is low but moves to an Exit1-IR state 74 when the TMS signal is high. When TAP controller 44 is in state 72, program control remains in state 72 when the TMS signal is low but moves to Exit1-IR state 74 when the TMS signal is high. When TAP controller 44 is in state 74, program control moves to Pause-IR state 76 when the TMS signal is low but moves to an Update-IR state 78 when the TMS signal is high. When TAP controller 44 is in state 76, program control remains in state 76 when the TMS signal is low but moves to an Exit2-IR state 80 when the TMS signal is high. When TAP controller 44 is in state 80, program control moves back to Shift-IR state 72 when the TMS signal is low but moves to Update-IR state 78 when the TMS signal is high. When TAP controller 44 is in state 78, program control returns to Run-Test/Idle state 62 when the TMS signal is low and returns to Select-DR-Scan state 64 when the TMS signal is high.

When TAP controller 44 is in Capture-DR state 66, program control moves to Shift-DR state 82 when the TMS signal is low but moves to Exit1-DR state 84 when the TMS signal is high. When TAP controller 44 is in state 82, program control remains in state 82 when the TMS signal is low but moves to Exit1-DR state 84 when the TMS signal is high. When TAP controller 44 is in state 84, program control moves to Pause-DR state 86 when the TMS signal is low but moves to an Update-DR state 88 when the TMS signal is high. When TAP controller 44 is in state 86, program control remains in state 86 when the TMS signal is low but moves to an Exit2-DR state 90 when the TMS signal is high. When TAP controller 44 is in state 90, program control moves back to Shift-DR state 82 when the TMS signal is low but moves to Update-DR state 88 when the TMS signal is high. When TAP controller 44 is in state 88, program control returns to Run-Test/Idle state 62 when the TMS signal is low and returns to Select-DR-Scan state 64 when the TMS signal is high.

Although these states for TAP controller 44 (FIG. 2) are well known, activities occurring during these states as a result of mode selection logic 58 permit BSIC 28 to operate in accordance with the teaching of the present invention. In particular, these activities relate to the operation of BSIC 28 while system action instructions are active. BSIC 28 then operates in a pin-permission mode. Instructions become active as TAP controller 44 passes through Update-IR state 78. These system action instructions are known and include EXTEST, INTEST, RUNBIST, CLAMP, and HIGHZ instructions. Generally speaking, system action instructions require Boundary-Scan testing to influence signals at pins 30, 32 (FIG. 2). In contrast, when non-system action instructions are active, BSIC 28 operates in a non-invasive mode. Non-system action instructions include BYPASS, SAMPLE/PRELOAD, IDCODE, and USERCODE instructions. When non-system action instructions are active, data may be shifted through chain 24 (FIG. 1) without influencing signals present on pins 30, 32 or system operations of BSICs 28 in system 10.

As noted in FIG. 3, when a system action instruction is active, pins 30, 32 (FIG. 2) are isolated from core logic 34 during Run-Test/Idle state 62, Select-DR-Scan state 64, Capture-DR state 66, and Update-DR state 88. However, pins 30, 32 are coupled to core logic 34 during Test-Logic-Reset state 60, all of instruction register (IR) states 68, 70, 72, 74, 76, 78, 80, and data register (DR) states 82, 84, 86, 90, regardless of whether a system action instruction is active.

Figure 4:
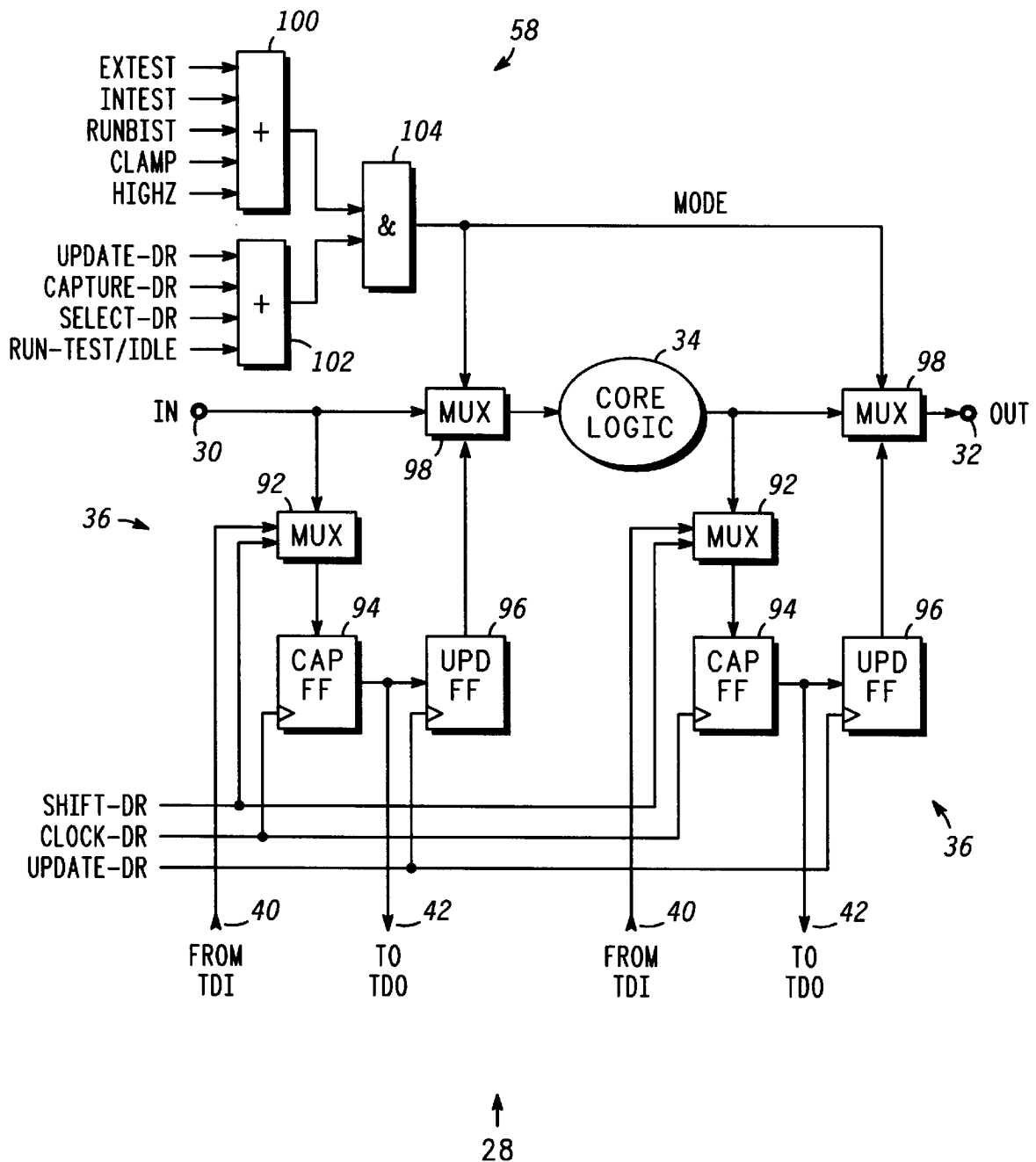
FIG. 4 is a block diagram of mode selection logic and Boundary-Scan cells associated with BSIC input and output pins.

FIG. 4 is a block diagram of an embodiment of mode selection logic 58 in cooperation with BS cells 36, specifically illustrating one BS cell 36 associated with input pin 30 and one BS cell 36 associated with output pin 32. Any number of cells 36 may be included in BSIC 28.

BS cells 36 may be conventionally implemented. For example, for any BS cell 36, one data input of multiplexer (MUX) 92 may receive a system signal via input pin 30 or core logic 34. Another data input of multiplexer 92 may receive serial data through TDI pin 40. A selection input of MUX 92 may be driven by a signal from state decoder 46 (FIG. 2) indicating when TAP controller 44 (FIGS. 2–3) is operating in Shift-DR state 82 (FIG. 3). Polarities may be arranged so that serial data from the direction of TDI pin 40 is presented at the output of multiplexer 92 during Shift-DR state 82, and the system signal is presented at the output of multiplexer 92 during all other states.

The output of multiplexer 92 may drive a data input of capture flip-flop (CAP FF) 94. Capture flip-flop 94 may receive a clock signal with timing equivalent to the TCK signal when operating in data register (DR) states 64, 66, 82, 84, 86, 88, 90. While shifting data through chain 24 (FIG. 1), capture flip-flop 94 serves as Boundary-Scan register 38 (FIG. 2). When performing an EXTEST instruction, capture flip-flop 94 for BS cell 36 associated with input pin 30 captures the signal present at pin 30. When performing an INTEST instruction, capture flip-flop 94 for BS cell 36 associated with output pin 32 captures a signal generated by core logic 34.

The output of capture flip-flop 94 couples to a data input of an update flip-flop (UPD FF) 96. Update flip-flop 96 desirably receives a clock signal at the end of Update-DR state 88 (FIG. 3). Accordingly, a double buffering scheme is implemented, and the contents of capture flip-flop 94 are transferred to update flip-flop 96 during Update-DR state 88.

The output of update flip-flop 96 may couple to a first data input of multiplexer (MUX) 98. A second data input of multiplexer 98 receives a signal from the system via input pin 30 or core logic 34. An output of multiplexer 98 provides a signal to system elements, i.e., core logic 34 or output pin 32. The MODE signal drives a selection input of multiplexer 98. Thus, when the MODE signal is active, the output of update flip-flop 96 appears at the output of multiplexer 98, and Boundary-Scan register 38 asserts a system action. When the MODE signal is inactive, the system signal available from input pin 30 or from core logic 34 appears at the output of multiplexer 98, and Boundary-Scan elements refrain from asserting a system action. Action asserted by BS cells 36 through output pins 32 of one BSIC 28 may not always be compatible with system actions asserted by other BSICs 28 or other devices in system 10 when the BSICs 28 and other devices couple to a common resource, i.e., D/C bus 14 (FIG. 1). This potential incompatibility is addressed through the operation of Boundary-Scan master 22, discussed below.

The MODE signal defines whether pins 30, 32 are isolated from or coupled to core logic 34. Mode selection logic 58 includes OR section 100 that receives inputs from instruction register decoder 50 (FIG. 2). Inputs from decoder 50 to OR section 100 cause an active output from OR section 100 whenever a system action or pin permission instruction is active, e.g., individual signals identifying EXTEST, INTEST, RUNBIST, CLAMP, and HIGHZ instructions may drive OR section 100. Mode selection logic 58 additionally includes OR section 102 receiving inputs from state decoder 46 (FIG. 2). Inputs from state decoder 46 cause an output of OR section 102 to activate whenever TAP controller 44 is operating in Update-DR, Capture-DR, Select-DR, or Run-Test/Idle states 88, 66, 64, 62, respectively. The outputs of OR sections 100, 102 couple to respective inputs of AND (&) section 104. An output of AND section 104 generates the MODE signal.

Consequently, the MODE signal activates during states 88, 66, 64, and/or 62, but only when a system action instruction is active. Even while system action instructions are active, during all other states, including Shift-DR state 82, Update-IR state 78, Exit1-DR state 84, Pause-DR state 86, and Exit2-DR state 90, the MODE signal is inactive, and Boundary-Scan elements of BSIC 28 refrain from asserting a system action.

Figure 5:
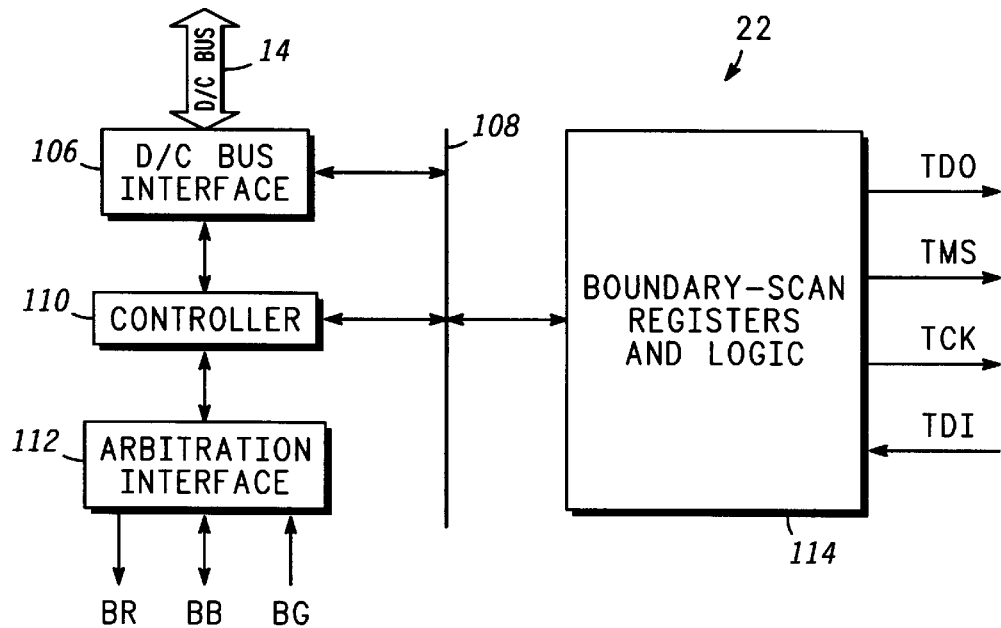
FIG. 5 is a block diagram of an exemplary Boundary-Scan master.

FIG. 5 is a block diagram of exemplary Boundary-Scan master 22, including D/C bus interface 106 coupled to D/C bus 14. D/C bus interface 106 couples to internal bus 108 and to controller 110. Controller 110 also couples to internal bus 108 and to arbitration interface 112. Arbitration interface 112 couples to bus arbitrator 26 (FIG. 1) and generates the bus request (BR) signal, receives the bus granted (BG) signal, and interfaces with the bus busy (BB) signal. Boundary-Scan registers and logic 114 are coupled to internal bus 108 and perform conventional Boundary-Scan master functions, including generation of test data output (TDO), test mode select (TMS), and test clock (TCK) signals and reception of the test data input (TDI) signal.

Boundary-Scan master 22 communicates with microprocessor 12 (FIG. 1) through D/C bus 14 and D/C bus interface 106. This communication includes receipt at Boundary-Scan master 22 of programming data defining test vectors for chain 24 (FIG. 1) and defining sequencing through states by TAP controllers 44 (FIG. 2). These programming data are stored in and formatted by Boundary-Scan registers and logic 114. Test vector data are provided serially to chain 24 through the TDO and TCK signals. Sequencing of TAP controller 44 through its states is controlled by the TMS and TCK signals. Test signatures are received from chain 24 through TCK and TDI signals and may be communicated back to microprocessor 12 through D/C bus interface 106 and D/C bus 14 for verification of proper operation.

Controller 110 operates conventionally to assist in managing communications taking place between Boundary-Scan registers and logic 114 and microprocessor 12. Controller 110 also determines when to request control of D/C bus 14. Boundary-Scan master 22 requests and is granted control of D/C bus 14 so that D/C bus 14 will be free for testing purposes and so that tests imposing system actions on D/C bus 14 will have no substantial influence on system functions. Desirably, Boundary-Scan master 22 grabs control of D/C bus 14 no more than is necessary for carrying out Boundary-Scan tests.

Figure 6:
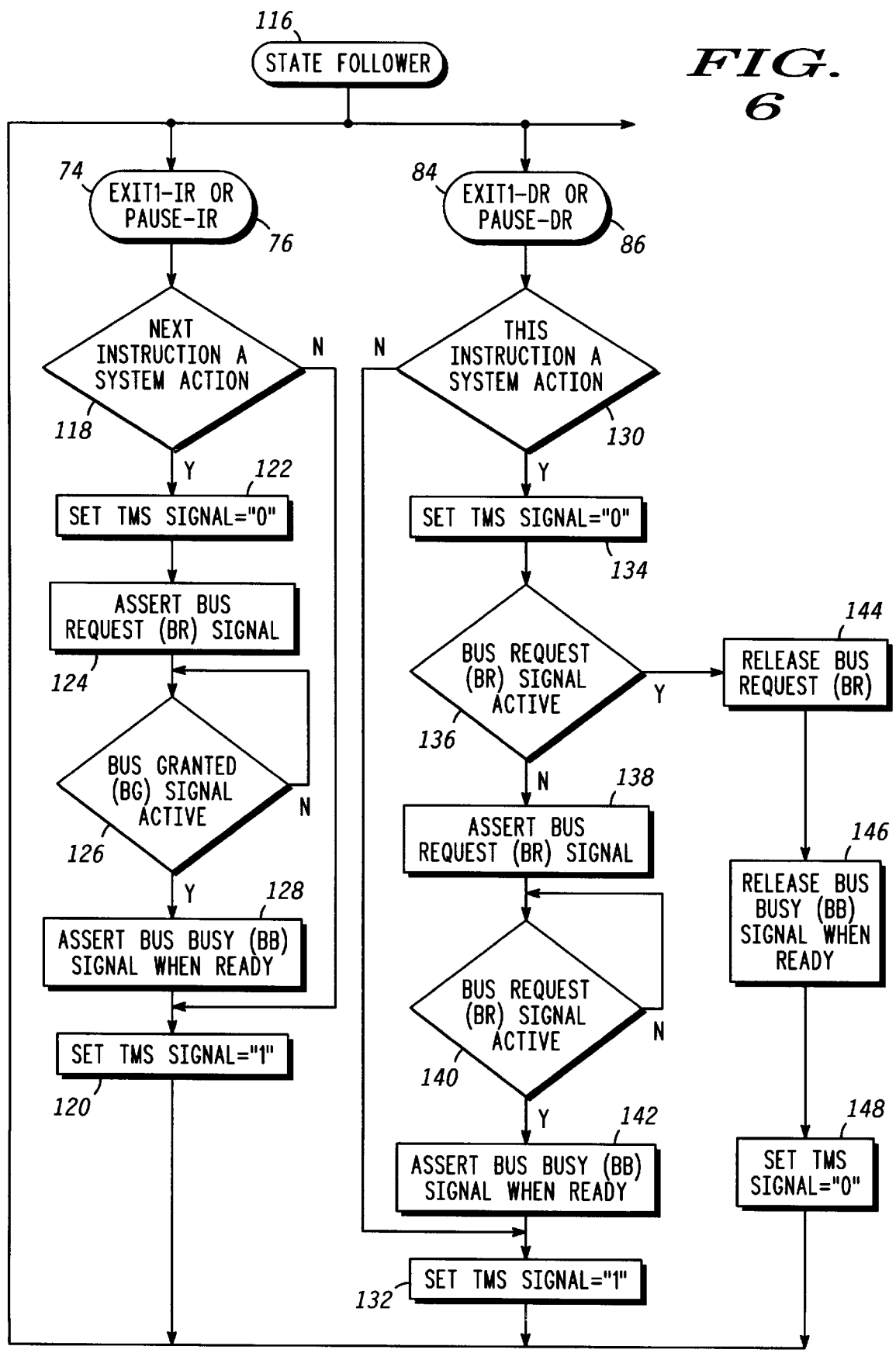
FIG. 6 is a flow chart of a process performed by the Boundary-Scan master.

FIG. 6 is a flow chart of state follower process 116 performed by Boundary-Scan master 22. Process 116 manages control exerted over D/C bus 14 (FIGS. 1, 5) by Boundary-Scan master 22 and operates in cooperation with BSICs 28 (FIGS. 1–4). Process 116 determines when BSICs 28 are about to assert a system action. Before system action is asserted, process 116 causes Boundary-Scan master 22 to request and be granted control of D/C bus 14. Process 116 coordinates TMS and/or TCK signals (FIG. 5) so that system action is not asserted until control of D/C bus 14 is obtained.

Process 116 follows states through which TAP controller 44 (FIG. 3) sequences. Boundary-Scan master 22 passively follows the sequencing of states in response to TMS and TCK signals (FIG. 5) that Boundary-Scan master 22 generates. When Exit1-IR state 74 and/or Pause-IR state 76 are detected, process 116 performs query task 118. States 74, 76 occur when an instruction is about to be loaded in instruction register 48. The instruction will not become active until Update-IR state 78 (FIG. 3) is performed. These states may indicate upcoming assertion of a system action.

Task 118 determines whether the next instruction about to become active is a system action instruction, such as EXTEST, INTEST, RUNBIST, CLAMP, or HIGHZ. If the next instruction is not a system action instruction, program control proceeds through task 120, setting the TMS signal to a high ("1") level, then returns to passively following the states of TAP controller 44. Setting of the TMS signal to a high level allows TAP Controller 44 (FIG. 3) to directly sequence into Update-IR state 78 so that the next instruction will become active.

When task 118 determines that the next instruction is a system action instruction, task 122 sets the TMS signal to a low ("0") level, causing TAP controller 44 to remain in Pause-IR state 76 (FIG. 3). After task 122, task 124 causes arbitration interface 112 (FIG. 5) to assert the bus request (BR) signal, thereby requesting control of D/C bus 14 (FIGS. 1, 5) from bus arbitrator 26 (FIG. 1).

After task 124, query task 126 causes arbitration interface 112 to determine whether the bus granted (BG) signal has been activated. The BG signal activates when bus arbitrator 26 decides to activate it. Thus, the amount of time elapsing between request and grant is beyond the control of Boundary-Scan master 22 and may vary from request to request. When task 126 determines that the BG signal is not yet active, program control remains at task 126. When task 126 determines that the BG signal has activated, task 128 asserts or otherwise activates the bus busy (BB) signal when it is clear to do so. Boundary-Scan master 22 has now asserted control of D/C bus 14 and all other devices (BSICs 28 or otherwise) coupled to D/C bus 14 refrain from placing signals upon it.

After task 128, program control proceeds through task 120, which sets the TMS signal to a high ("1") level, then returns to passively following the states of TAP controller 44. Setting the TMS signal to a high level allows TAP Controller 44 to sequence directly on to Update-IR state 78 so that the upcoming system action instruction will become active. Sequencing of states in TAP controller 44 (FIG. 3) proceeds from Update-IR state 78 to Run-Test/Idle state 62 or Select-DR-Scan state 64. If a system action instruction is active at that point, states 62, 64 isolate pins from core logic in BSICs 28 and allow Boundary-Scan elements to assert a system action. Accordingly, a prior-executed PRELOAD instruction may load a test vector in Boundary-Scan register 38 (FIG. 2), and this test vector is asserted on system 10 beginning in states 62 or 64.

When, while passively following the states of TAP controller 44, Exit1-DR state 84 and/or Pause-DR state 86 are detected, process 116 performs query task 130. States 84, 86 occur when update flip-flops 96 (FIG. 4) of BS cells 36 are about to be loaded from capture flip-flops 94, i.e., when either a test vector is about to be loaded for use in performing a Boundary-Scan test or when a signature is about to be loaded to record the results of a Boundary-Scan test.

Task 130 determines whether the currently active instruction is a system action instruction, e.g., EXTEST, INTEST, RUNBIST, CLAMP, or HIGHZ. If this instruction is not a system action instruction, program control proceeds through task 132, setting the TMS signal to a high ("1") level, then returning to passively following states of TAP controller 44. Setting the TMS signal to a high level allows TAP Controller 44 to directly sequence on to Update-DR state 88 (FIG. 3) so that update flip-flops 96 in BS cells 36 (FIG. 4) will be loaded.

When task 130 determines that the current instruction is a system action instruction, task 134 sets the TMS signal to a low ("0") level, holding TAP controller 44 in Pause-DR state 86. After task 134, query task 136 determines whether Boundary-Scan master 22 has already activated its bus request (BR) signal. When the BR signal is already active, a Boundary-Scan test has been performed and captured in capture flip-flops 94 (FIG. 4), and a signature is about to be transferred to update flip-flops 96 to record the results. When the BR signal is not already active, no Boundary-Scan test has been started, but a test vector is about to be loaded from capture flip-flops 94 into update flip-flops 96 for use in performing a Boundary-Scan test.

When task 136 determines that D/C bus 14 (FIGS. 1, 5) is not already controlled by Boundary-Scan master 22, task 138 causes arbitration interface 112 (FIG. 5) to assert the bus request (BR) signal, requesting control of D/C bus 14 from bus arbitrator 26 (FIG. 1).

After task 138, query task 140 causes arbitration interface 112 to determine whether the bus granted (BG) signal has been activated. When the BG signal is not yet active, program control remains at task 140. When the BG signal has activated, task 142 asserts the bus busy (BB) signal when it is clear to do so and Boundary-Scan master 22 has asserted control of D/C bus 14, and all other devices (BSICs 28 or otherwise) coupled to D/C bus 14 refrain from placing signals upon it.

After task 142, program control proceeds through task 132, setting the TMS signal to a high ("1") level, then returning to passively following states of TAP controller 44. Setting the TMS signal to a high level allows TAP controller 44 to sequence to Update-DR state 88 so that a test vector can be loaded into update flip flops 96 (FIG. 4). When a system action instruction is active, BSIC pins will be isolated from core logic during state 88 (FIG. 3). Thus, BSICs 28 will cause Boundary-Scan elements to assert a system action.

When task 136 determines that D/C bus 14 (FIGS. 1, 5) is controlled by Boundary-Scan master 22, tasks 144, 146 cause arbitration interface 112 (FIG. 5) to release bus request (BR) and bus busy (BB) signals, releasing control of D/C bus 14. System 10 may then immediately continue with its system functions without requiring a reset or the recycling of power. After task 146, task 148 sets the TMS signal to a low ("0") level, causing TAP controller 44 to remain at Pause-DR state 86. After task 148, program control returns to passively monitoring the states through which TAP controller 44 sequences.

Of course, TAP controllers 44 in BSICs 28 need not remain in Pause-DR state 86. Since Boundary-Scan master 22 no longer controls D/C bus 14, microprocessor 12 (FIG. 1) is free to load new programming data into Boundary-Scan master 22. This new programming data may define the further sequencing of states at TAP controllers 44.

Accordingly, Boundary-Scan master 22 monitors its TMS and TCK signals to determine when TAP controllers 44 associated with chain 24 (FIG. 1) are about to sequence into a state that will assert a system action. Before the system action is asserted, Boundary-Scan master 22 requests control of D/C bus 14 and holds TAP controllers 44 in Pause-IR state 76 or Pause-DR state 86 until control of D/C bus 14 is granted by bus arbitrator 26. Once control has been granted, TAP controllers 44 are allowed to sequence into states that will result in the assertion of system actions. Moreover, after the system action has occurred and test results have been captured, Boundary-Scan master 22 releases control of D/C bus 14.

In summary, the present invention provides an improved Boundary-Scan testable system and method. Boundary-Scan testing principles are extended to permit viable on-line Boundary-Scan testing. In particular, Boundary-Scan integrated circuits (BSICs) refrain from asserting system actions unless such system actions are directly needed for testing. For example, system actions are not asserted during the Shift-DR state, when test vectors and test signatures are being transferred from and to the Boundary-Scan master. As a result, BSICs spend much less time asserting Boundary-Scan system actions and are free to spend more time on the system functions for which they are intended.

In addition, a Boundary-Scan master is configured to control a common bus so that a system microprocessor or other controller can manage system Boundary-Scan testing, and an external controller is not required. The Boundary-Scan master stops all system-related bus activity prior to performing Boundary-Scan testing. This prevents bus interference from interfering with the testing. Moreover, the system controller may continue its processing after Boundary-Scan testing, and the system controller may continue where it left off prior to testing. No reset is required.

The present invention has been described above with reference to preferred embodiments. However, those skilled in the art will recognize that changes and modifications may be made in these preferred embodiments without departing from the scope of the present invention. For example, while the above description discusses controlling states through the regulation of the TMS signal, those skilled in the art will appreciate that the TCK signal may be used for the same purpose. Likewise, those skilled in the art will appreciate that numerous specific implementations may be devised to generate MODE signals functioning as described herein and to coordinate TMS and TCK signals with bus arbitration as described herein. These and other changes and modifications which are obvious to those skilled in the art are intended to be included within the scope of the present invention.

What is claimed is:

1. A method of operating a Boundary-Scan master coupled to a data and control bus, said method comprising steps of:

determining when an external test (EXTEST) instruction will assert a system action; and requesting control of said data and control bus prior to said assertion of said system action;

wherein said Boundary-Scan master generates a test mode select (TMS) signal which controls Boundary-Scan testing of an integrated circuit (IC) having an instruction register and a test access port (TAP) controller for operating in a plurality of states, including an EXIT1-DR state; and wherein said determining step comprises a step of identifying when said EXTEST instruction is loaded in said instruction register of said IC and said TAP controller has entered said EXIT1-DR state.

2. A method of operating a Boundary-Scan master coupled to a data and control bus, said method comprising steps of:

determining when an external test (EXTEST) instruction will assert a system action; and requesting control of said data and control bus prior to said assertion of said system action;

wherein said Boundary-Scan master generates a test mode select (TMS) signal for controlling Boundary-Scan testing of an integrated circuit (IC) having an instruction register and a test access port (TAP) controller for operating in a plurality of states, including a PAUSE-DR state;

said Boundary-Scan master generates a bus request signal and receives a bus granted signal; and said method additionally comprises, in response to said determining step, steps of:
    activating said bus request signal;
    controlling said TMS signal to hold said TAP controller in said PAUSE-DR state until said bus granted signal is received; and
    controlling said TMS signal so that said TAP controller exits said PAUSE-DR state after said bus granted signal is received.

3. A method as claimed in claim 2 additionally comprising, prior to said activating step, steps of:

determining whether said data and control bus is already controlled by said Boundary-Scan master; and releasing control of said data and control bus when said data and control bus is already controlled by said Boundary-Scan master.

4. A method of operating a Boundary-Scan master coupled to a data and control bus, said method comprising steps of:

determining when an external test (EXTEST) instruction will assert a system action; and requesting control of said data and control bus prior to said assertion of said system action;

wherein said Boundary-Scan master generates a test mode select (TMS) signal for controlling Boundary-Scan testing of an integrated circuit (IC) having an instruction register and a test access port (TAP) controller for operating in a plurality of states, including a PAUSE-IR state;

said Boundary-Scan master generates a bus request signal and receives a bus granted signal; and said method additionally comprises, in response to said determining step, steps of:
    activating said bus request signal;
    controlling said TMS signal to hold said TAP controller in said PAUSE-IR state until said bus granted signal is received; and
    regulating said TMS signal so that said TAP controller exits said PAUSE-IR state after said bus granted signal is received.

5. A method as claimed in claim 4 wherein said TAP controller is additionally for operating in an EXIT1-DR state, and said method additionally comprises, after said regulating step, steps of:

identifying when said EXTEST instruction is loaded in said instruction register and said TAP controller has entered said EXIT1-DR state;

determining, in response to said identifying step, whether said data and control bus is being controlled by said Boundary-Scan master; and releasing control of said data and control bus when said data and control bus is being controlled by said Boundary-Scan master.

6. A Boundary-Scan master for coupling to a data and control bus through which data defining Boundary-Scan tests are received, said Boundary-Scan master comprising:

an arbitration interface; and control means, coupled to said arbitration interface, for determining when to request control of said data and control bus;

wherein said Boundary-Scan master additionally comprises:

means, coupled to said control means, for generating a test mode select (TMS) signal which controls Boundary-Scan testing of an integrated circuit (IC) having an instruction register and a test access port (TAP) controller for operating in a plurality of states, including a PAUSE-DR state; and said control means is configured to:
    cause said arbitration interface to generate a bus request output signal, and
    cause said generating means to control said TMS signal so that said TAP controller of said IC is held in said PAUSE-DR state until a bus granted input signal is received at said arbitration interface.

7. A Boundary-Scan master as claimed in claim 6 wherein said control means is further configured to cause said generating means to control said TMS signal so that said TAP controller exits said PAUSE-DR state after said bus granted signal is received.

8. A Boundary-Scan master as claimed in claim 7 wherein said control means is further configured to:

determine, prior to generation of said bus request output signal, whether said data and control bus is already being controlled by said Boundary-Scan master; and cause said arbitration interface to release control of said data and control bus when said data and control bus is already being controlled by said Boundary-Scan master.

9. A Boundary-Scan master for coupling to a data and control bus through which data defining Boundary-Scan tests are received, said Boundary-Scan master comprising:

an arbitration interface; and control means, coupled to said arbitration interface, for determining when to request control of said data and control bus;

wherein said Boundary-Scan master additionally comprises:

means, coupled to said control means, for generating a test mode select (TMS) signal which controls Boundary-Scan testing of an integrated circuit (IC) having an instruction register and a test access port (TAP) controller for operating in a plurality of states, including an EXIT1-DR state, and for generating a test data output (TDO) signal which supplies data to said IC; and said control means is configured to cause said arbitration interface to request control of said data and control bus when an external test (EXTEST) instruction has been loaded in said instruction register of said IC through manipulation of said TMS and TDO signals and said TAP controller has passed through said EXIT1-DR state.

10. A Boundary-Scan master for coupling to a data and control bus through which data defining Boundary-Scan tests are received, said Boundary-Scan master comprising:

an arbitration interface; and control means, coupled to said arbitration interface, for determining when to request control of said data and control bus;

wherein said Boundary-Scan master additionally comprises:

means, coupled to said control means, for generating a test mode select (TMS) signal which controls Boundary-Scan testing of a Boundary-Scan integrated circuit (BSIC), wherein:

said BSIC includes at least one output pin, core logic, an instruction register, a test access port (TAP) controller for operating in a plurality of states, including an UPDATE-DR state and a SHIFT-DR state, and a Boundary-Scan cell coupled between said core logic and said output pin;

said BSIC is configured to isolate said output pin from said core logic during said UPDATE-DR state when said instruction register contains an external test (EXTEST) instruction; and said BSIC is further configured to couple said output pin to said core logic during said SHIFT-DR state when said instruction register contains said EXTEST instruction.

11. A Boundary-Scan testable electronic system comprising:

at least one Boundary-Scan integrated circuit (BSIC);

a data and control bus;

a Boundary-Scan master, coupled to said BSIC and said data and control bus, said Boundary-Scan master including an arbitration interface and a controller that determines when to request control of said data and control bus; and a bus arbitrator coupled to said arbitration interface, said bus arbitrator configured to grant control of said data and control bus;

wherein said BSIC has an instruction register and a test access port (TAP) controller operable in a plurality of states, including a Pause-DR state;

said master additionally comprises means, coupled to said control means, for generating a test mode select (TMS) signal which is fed to said BSIC and controls sequencing of said TAP controller through said states; and said controller is configured to:

cause said arbitration interface to generate a bus request output signal which is fed to said bus arbitrator, and cause said generating means to control said TMS signal so that said TAP controller of said BSIC is held in said Pause-DR state until a bus granted input signal is received from said bus arbitrator at said arbitration interface.

12. A Boundary-Scan testable electronic system comprising:

at least one Boundary-Scan integrated circuit (BSIC);

a data and control bus;

a Boundary-Scan master, coupled to said BSIC and said data and control bus, said Boundary-Scan master including an arbitration interface and a controller that determines when to request control of said data and control bus; and a bus arbitrator coupled to said arbitration interface, said bus arbitrator configured to grant control of said data and control bus;

wherein said BSIC includes at least one output pin, core logic, an instruction register, a test access port (TAP) controller operable in a plurality of states, including an Update-DR state and a Shift-DR state, and a Boundary-Scan cell coupled between said core logic and said output pin;

said BSIC is configured to isolate said output pin from said core logic during said Update-DR state when said instruction register contains an external test (EXTEST) instruction; and said BSIC is further configured to couple said output pin to said core logic during said Shift-DR state when said instruction register contains said EXTEST instruction.

* * * * *